United States Patent [19]

McAusland

[11] 4,435,614
[45] Mar. 6, 1984

[54] ELONGATED PRINTED CIRCUIT FLEXIBLE CABLES AND METHOD OF MAKING THE SAME

[75] Inventor: Robert R. McAusland, Seattle, Wash.

[73] Assignee: Advanced Technology Laboratories, Bellevue, Wash.

[21] Appl. No.: 470,692

[22] Filed: Feb. 28, 1983

[51] Int. Cl.³ .................. H01B 7/04; H01B 7/08; H01B 13/00
[52] U.S. Cl. .................. 174/117 PC; 29/829; 156/50; 361/398
[58] Field of Search .................. 174/117 PC; 361/398; 29/829, 846; 156/47, 50

[56] References Cited
U.S. PATENT DOCUMENTS 3,898,371 8/1975 Bridgett .................. 174/117 F

*Primary Examiner*—J. V. Truhe
*Assistant Examiner*—Morris H. Nimmo

*Attorney, Agent, or Firm*—Lawrence S. Levinson; Sanford J. Asman

[57] ABSTRACT

Elongated, flexible printed circuit board coaxial cable which is made using a pattern on a flexible PCB substrate on which coaxial cables are formed is described. A series of slits and folds allows one or more elongated cables to be formed in each pattern. Such cables are particularly useful for connecting multi-connector apparatus of the type which requires coaxial cables interconnected in very close spaces, such as the type used in ultrasound transducers.

The method for manufacturing such elongated, flexible printed circuit board coaxial cable is also described. The method includes forming a pattern on a flexible PCB substrate on which coaxial cables are formed. Thereafter, a series of slits and folds allows one or more elongated cables to be formed in each pattern.

Such cables are particularly useful for connecting multi-connector apparatus of the type which requires coaxial cables interconnected in very close spaces, such as the type used in ultrasound transducers.

8 Claims, 4 Drawing Figures

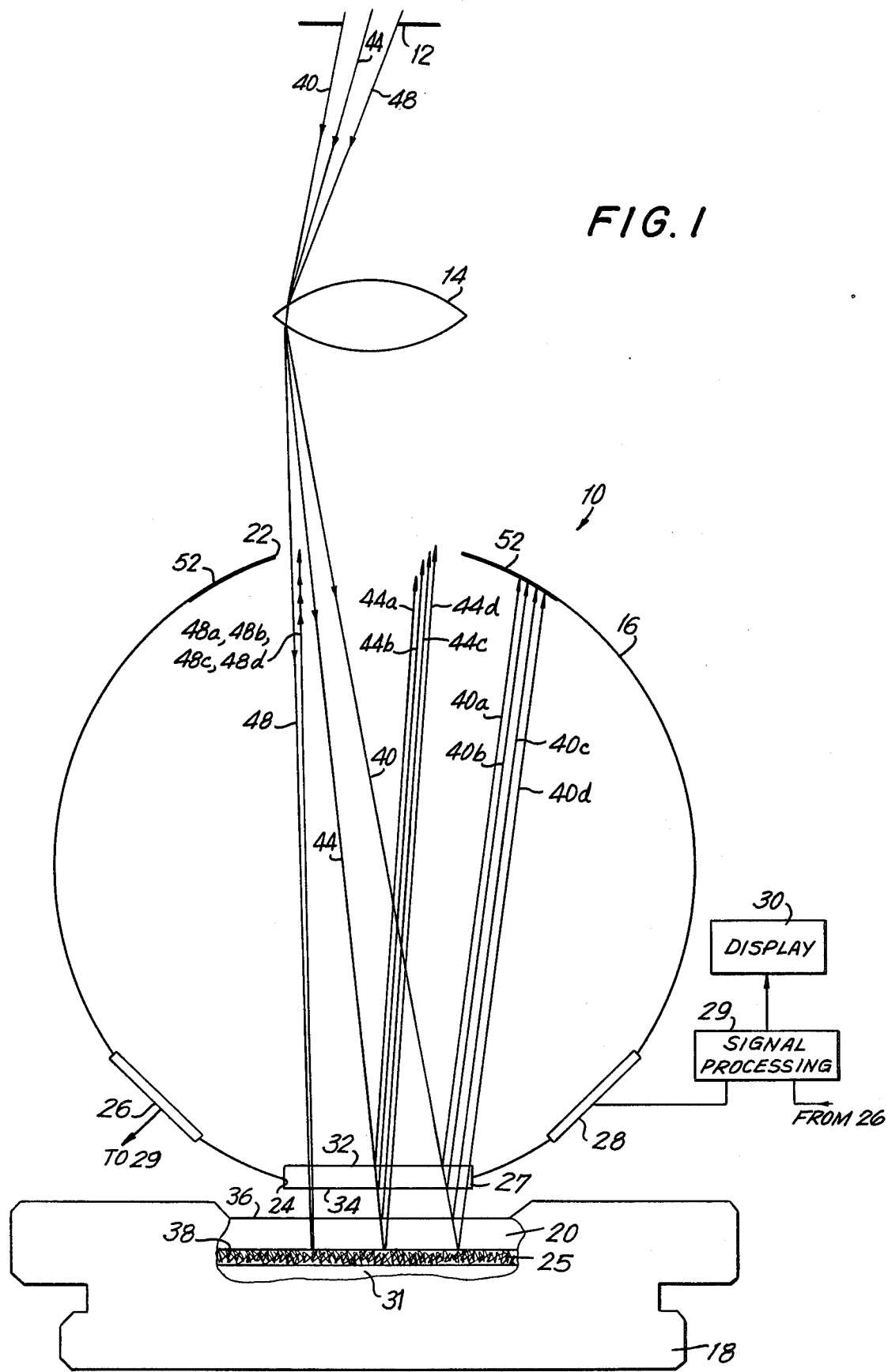

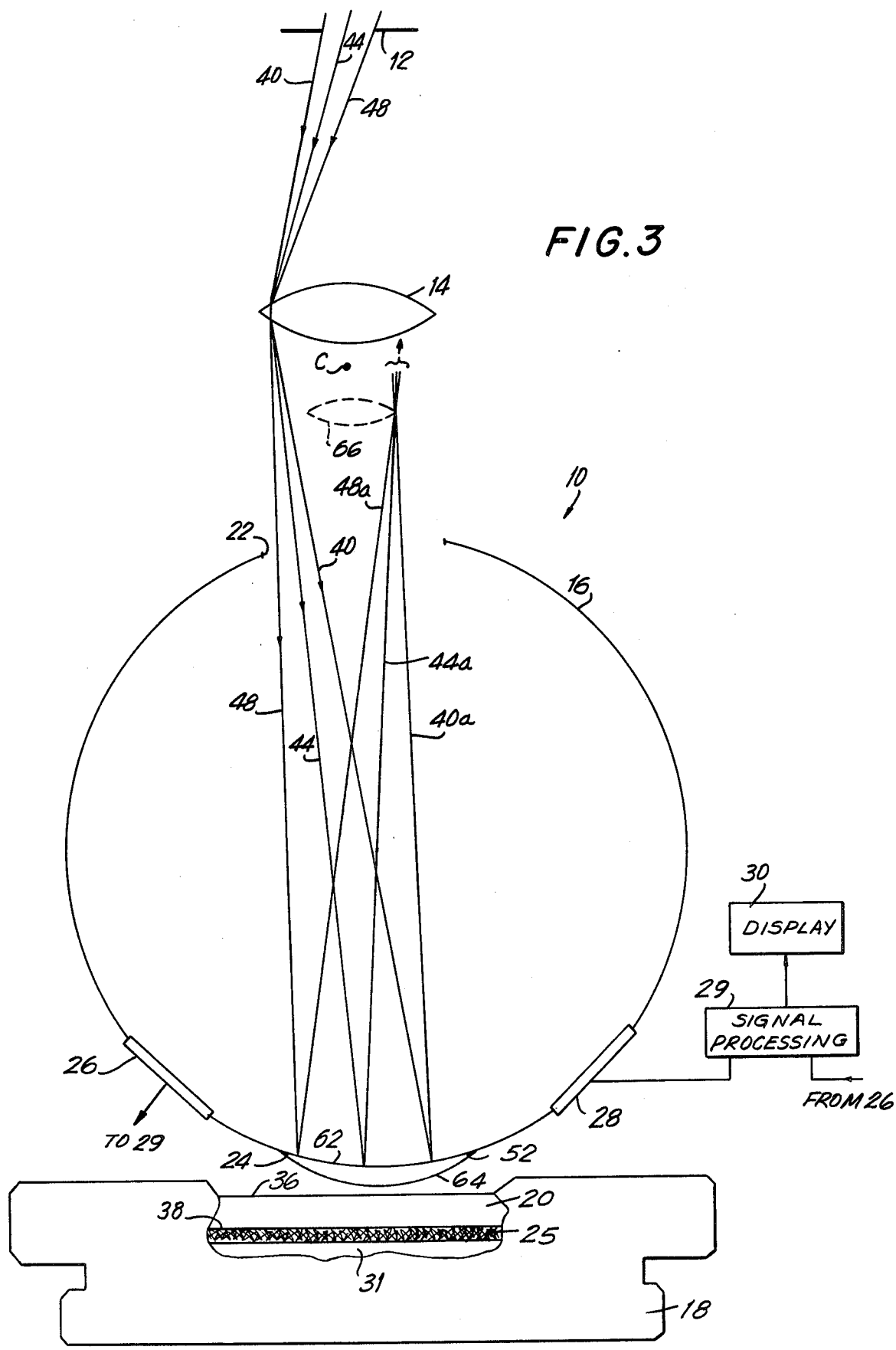

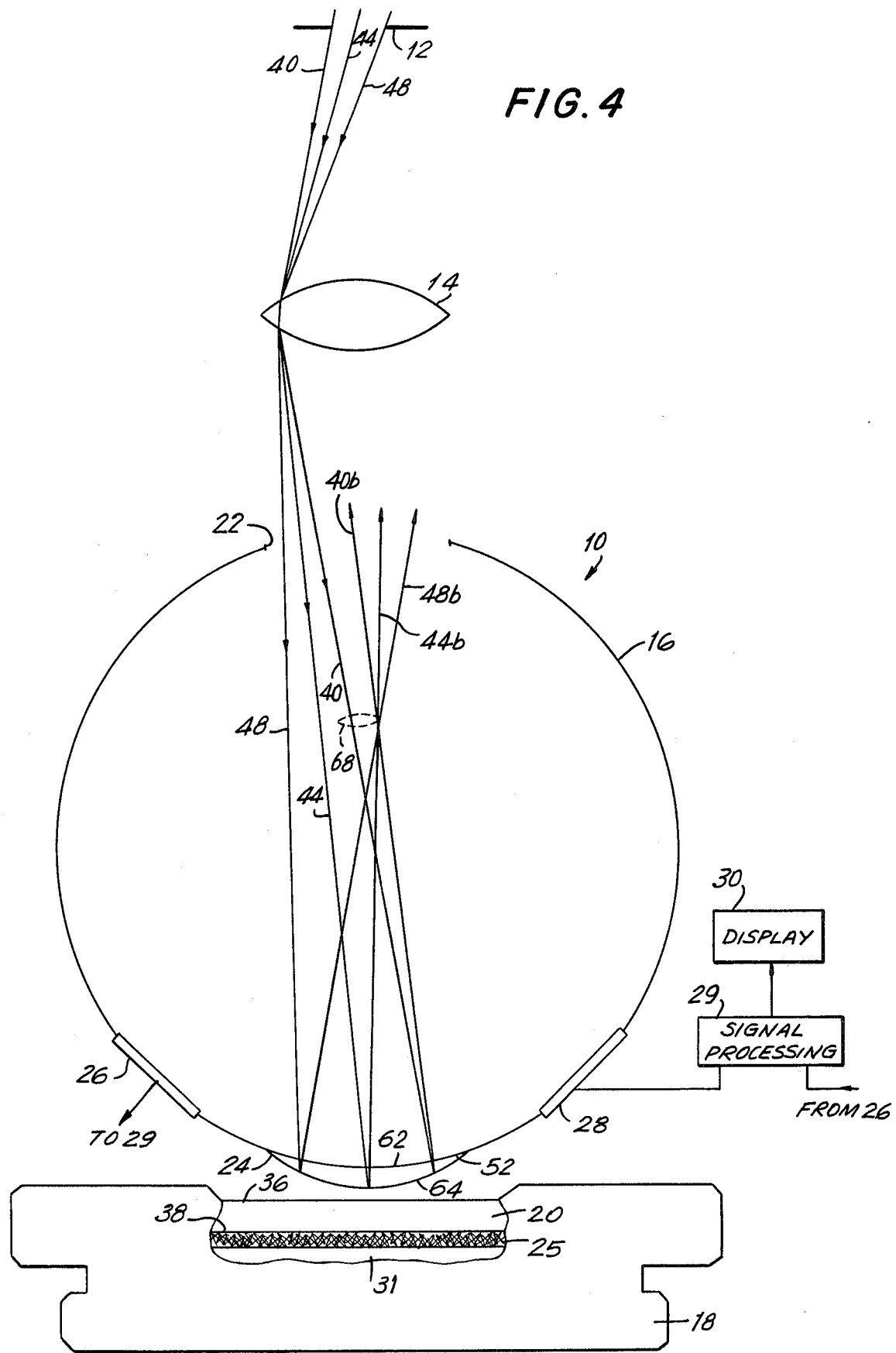

ELONGATED PRINTED CIRCUIT FLEXIBLE CABLES AND METHOD OF MAKING THE SAME

BACKGROUND OF THE INVENTION

The present invention relates to elongated flexible printed circuit board cables. In particular, the invention relates to a method for making elongated, flexible, coaxial cables which are substantially longer than those which have heretofore been available.

Long, flexible printed circuit board (PCB) coax cables are used in a number of applications. Such PCB coax cables are typically printed on or etched from a flexible substrate having an electrically conductive covering, such as copper. The substrate is typically comprised of a polyimide film. One such substrate is comprised of Dupont's Kapton brand polyimide film. In particular, such PCB coax cables are used in connection with ultrasound transducers, such as linear and phased array transducers, which have upwards of 64 elements, each of which must be connected to signal processor and display electronics by a coaxial, controlled impedence cable.

In order to keep cable size, weight, and stiffness to a minimum, very small coaxial wires have been developed. These coaxial wires typically have center conductors of 36 AWG or smaller. Consequently, they are very expensive to manufacture and to terminate. This is particularly true when such cables are used to connect to an ultrasound transducer in a scanhead where space is at a premium. Heretofore, the major part of the manufacturing cost of the scanhead utilizing a linear or phased array transducer has been in the cable and in its terminations.

A possible approach to eliminating the expense associated with attaching coaxial cables to an ultrasound transducer is to use flexible, PCB coax cables. Unfortunately, heretofore such flexible PCB coax cables have been limited in length to approximately 24 inches as a result of the manufacturing processes and equipment used to make them. In order to successfully utilize such cables in connection with ultrasound transducers, it is necessary for the cables to be approximately 6 to 8 feet long. Heretofore, no such cables were available.

SUMMARY OF THE INVENTION

In accordance with the present invention, an improved method for laying out and manufacturing flexible PCB coax cables is described. Utilizing the present invention, it is possible to make long PCB coax (i.e. ground and signal) cables on existing flexible PCB production equipment.

The long, flexible printed circuit board cable of the present invention comprises a pattern of cables on a flexible substrate. The pattern includes at least two substantially parallel, elongated sections joined by a perpendicular connecting section. This is a fold through one of the elongated sections on a fold line which is substantially perpendicular to the slit, and there is another fold through the connecting section along a second fold line substantially perpendicular to the first fold line. The second fold line is substantially aligned with the slit.

In accordance with the invention, the method of making a long, flexible printed circuit board cable comprises first forming a pattern of cables on a flexible substrate. The pattern must have at least two substantially parallel, elongated sections which are joined by a perpendicular connecting section. A fold is made through one of the elongated sections on a fold line which is substantially perpendicular to the slit separating the elongated sections. Then another fold is made through the connecting section along a second fold line which is substantially perpendicular to the first fold line and which is substantially aligned with the slit. The folded portions are then preferably glued to hold them in the appropriate position.

BRIEF DESCRIPTION OF THE DRAWING

In the Drawing

FIGS. 2-4 illustrates the steps used to convert the pattern of FIG. 1 into a long, flexible PCB coax cable.

DETAILED DESCRIPTION OF AN EXEMPLARY EMBODIMENT

Figure 1:
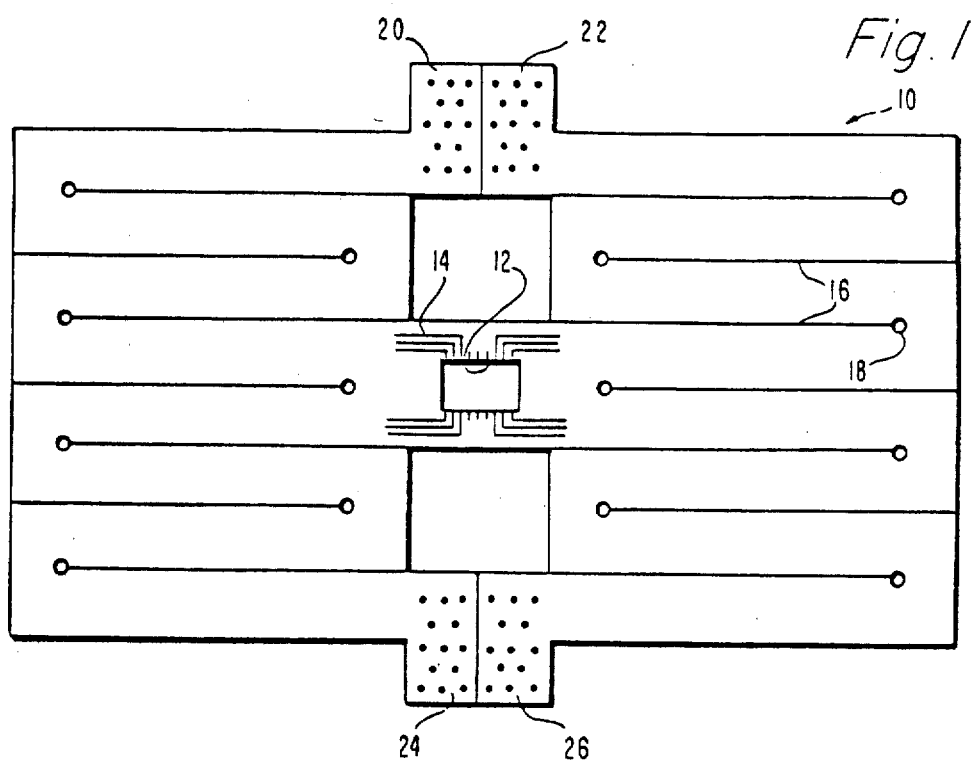
FIG. 1 shows a flexible PCB which is slit in accordance with the present invention in order to form a continuous cable.

Referring to FIG. 1, a pattern 10 of the type used in the preferred embodiment of the present invention for manufacturing long, continuous, flexible PCB coax cable is illustrated. In the center of the pattern 10 there is an opening 12 corresponding to the location where an ultrasound transducer will ultimately be mounted. A series of lines 14, corresponding to the coax cables are illustrated in the area of the transducer mounting location 12. In order to prevent obscuring the present invention, these lines 14, are not illustrated over the remainder of the pattern 10, although they are actually present.

The pattern 10 is printed over an area which corresponds to that which is within present manufacturing capabilities. The pattern 10 includes a number of slits 16 each of which preferably ends with a circular opening 18, which acts as a stress relief point. In the present embodiment of the invention, four different sections of flexible PCB coax cable end, respectively, in termination pads 20, 22, 24, 26. These correspond to four groups of cables 14 which extend between the pads 20-26 and the transducer mounting location 12. While this particular configuration is used to illutrate the invention, it will be understood by those skilled in the art that a greater or lesser number of groups of elongated, flexible PCB coax cables 14 could be manufactured without departing from the present invention.

Figure 2:
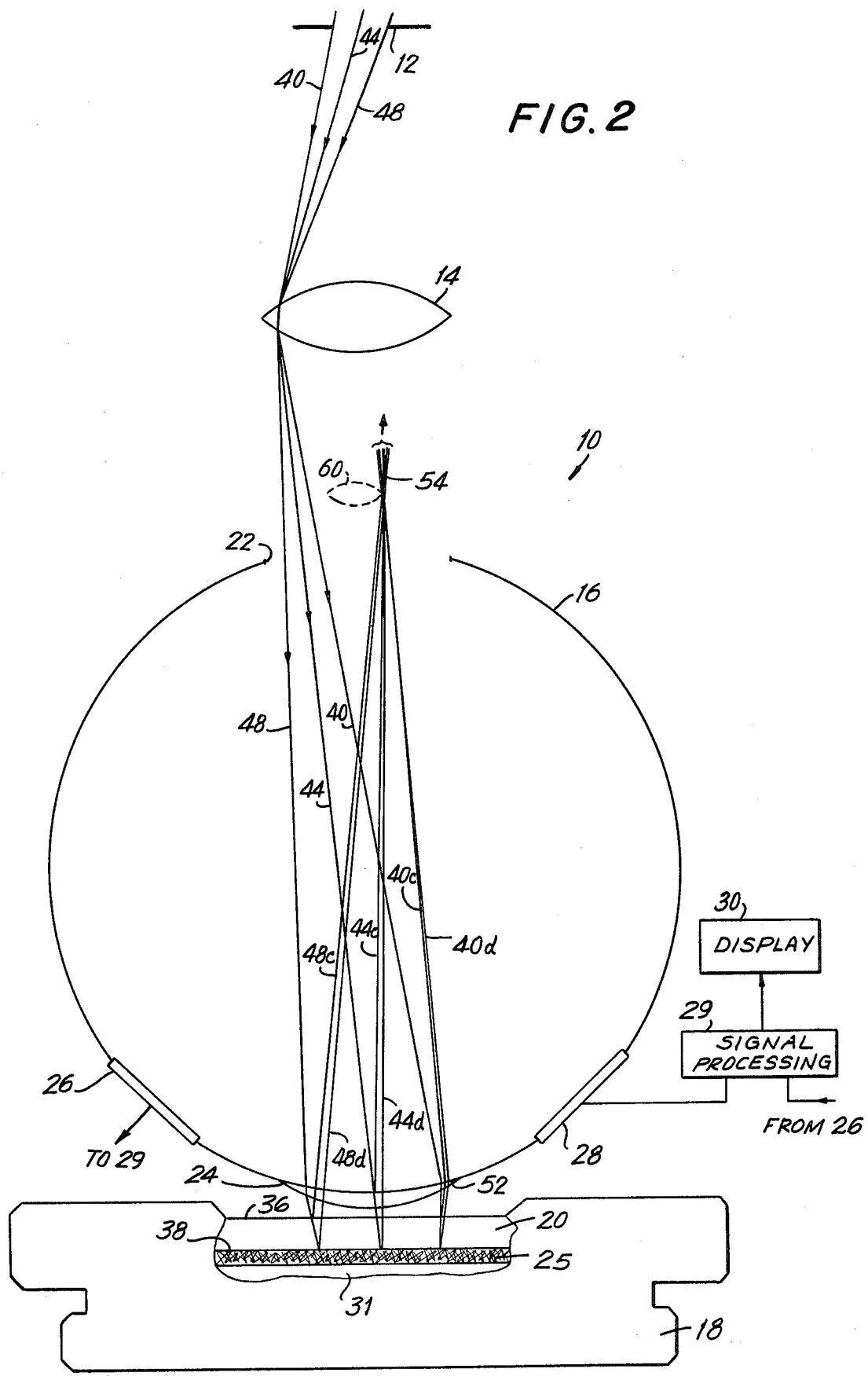

Referring to FIG. 2, an exploded portion 28 of a part of the pattern 10 of FIG. 1 is shown. The exploded portion 28 includes a section of the pattern 12 having a slit 16 which ends in a stress relief opening 18. In FIG. 2, the coax cables 14 are illustrated. As shown, the coax cables 14 are printed onto the flexible backing material in substantially parallel runs on elongated sections 25, 27. The cables 14 from the elongated sections 25, 27 are connected together via a connecting section 29. The cables 14 in the connecting section 29 are also substantially parallel to one another, but the cable runs in a connecting section 29 are perpendicular to the cable runs in the elongated sections 25, 27. The cables 14 are formed, and then they are insulated by a protective, transparent layer.

Referring now to FIG. 3, the elongated section 25 is first folded along a line 30 which is perpendicular to the slit 16, with the fold 30 being made at the stress relief opening 18. Thereafter, with reference to FIG. 4, a fold is made along a line 32 which is aligned with the slit 16 (and which extends through the center of the connecting section 29) whereby a long, continuous PCB coax cable is created. In the preferred embodiment of the invention, the flexible material is preferably glued to maintain the shape at the folds 30, 32 whereby a long, continuous PCB coax cable is manufactured.

As will be recognized by those skilled in the art, the manner of connecting the flexible coax cable to a transducer, in the case of an ultrasonic scanhead application, is via a reflow soldering technique of the type heretofore used. Such a method is particularly advantageous in that the cables made using the present invention have integral connectors formed on them. Also, the present technique can be employed to obtain long cables which are not coaxial in electrical characteristics.

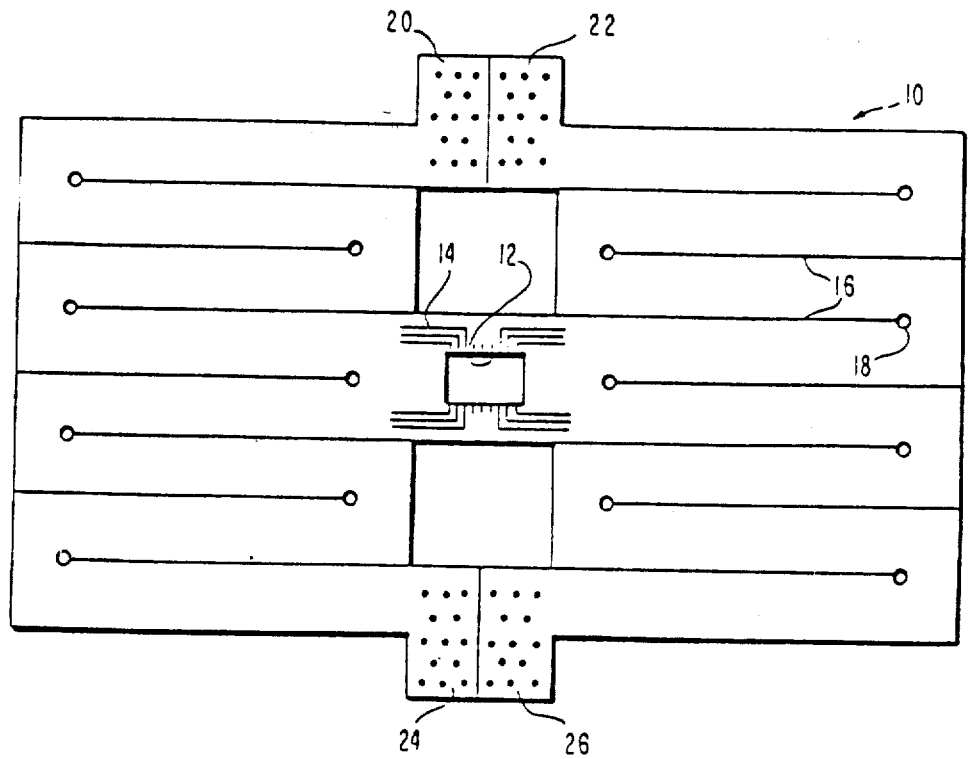

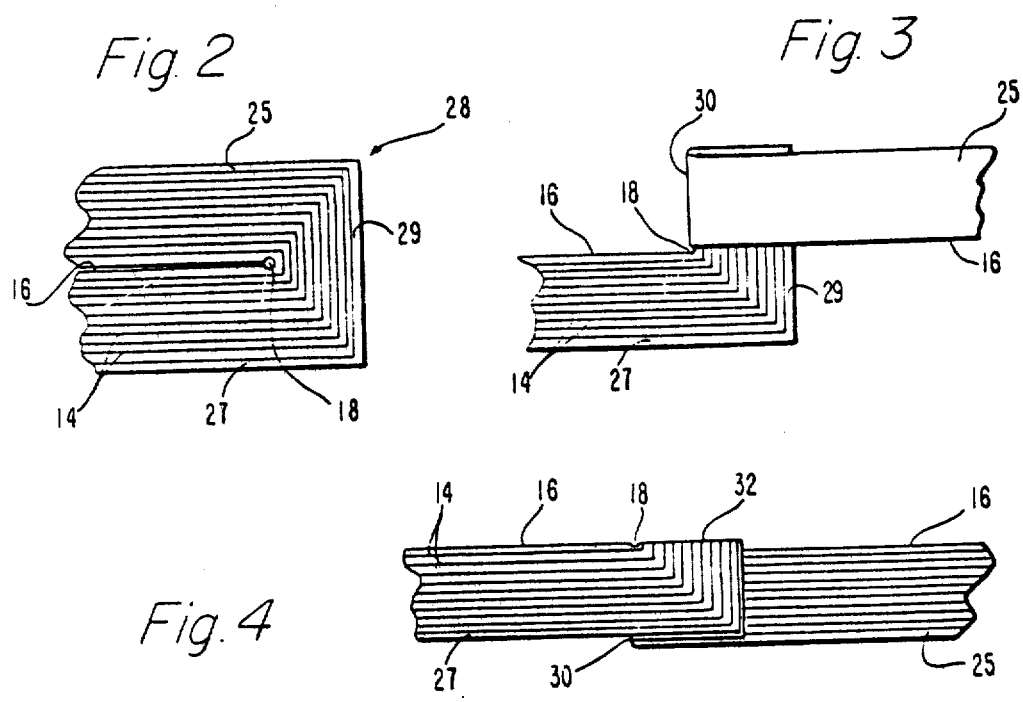

I claim:

1. A long, flexible printed circuit board cable comprising:
    (a) A pattern of cables on a flexible substrate, said pattern comprising at least two substantially parallel, elongated sections joined by a perpendicular connecting section and separated by a slit;
    (b) A fold through one of said elongated sections on a fold line substantially perpendicular to said slit; and
    (c) A fold through said connecting section along a second fold line substantially perpendicular to said first fold line and substantially aligned with said slit.

2. The apparatus of claim 1 further comprising a stress relief opening at the end of said slit which is adjacent to said connecting section.

3. The apparaus of claim 1 further comprising means for maintaining said folds in said substrate.

4. The apparatus of claim 4 wherein said means for maintaining said folds in said substrate comprises glue.

5. The apparatus of claim 1 further comprising integral connectors formed at the ends of said cable.

6. The method of making a long, flexible printed circuit board cable comprising:
    (a) Forming a pattern of cables on a flexible substrate, said pattern comprising at least two substantially parallel, elongated sections joined by a perpendicular connecting section;
    (b) Forming a slit between said elongated sections by slitting said pattern up to said connecting section;
    (c) Folding one of said elongated sections on a fold line substantially perpendicular to said slit; and
    (d) Folding said connecting section along a second fold line substantially perpendicular to said first fold line and substantially aligned with said slit.

7. The method of claim 7 further comprising the step of forming a stress relief opening at the end of said slit which is adjacent to said connecting section.

8. The method of claim 7 further comprising the step of gluing said substrate at said folds.

* * * * *

UNITED STATES PATENT AND TRADEMARK OFFICE
CERTIFICATE OF CORRECTION

PATENT NO. : 4,435,614
DATED : Mar. 6, 1984

Page 1 of 4

INVENTOR(S) : Robert R. McAusland

It is certified that error appears in the above-identified patent and that said Letters Patent is hereby corrected as shown below:

The title page and sheets 1 and 2 of the drawings containing Figs. 1, 2, 3 and 4 should appear as shown on the attached sheets.

Signed and Sealed this

Nineteenth Day of June 1984

[SEAL]

Attest:

Attesting Officer

GERALD J. MOSSINGHOFF

Commissioner of Patents and Trademarks

United States Patent [19]

McAusland

[11] 4,435,614
[45] Mar. 6, 1984

[54] ELONGATED PRINTED CIRCUIT FLEXIBLE CABLES AND METHOD OF MAKING THE SAME

[75] Inventor: Robert R. McAusland, Seattle, Wash.

[73] Assignee: Advanced Technology Laboratories, Bellevue, Wash.

[21] Appl. No.: 470,692

[22] Filed: Feb. 28, 1983

[51] Int. Cl.³ .................. H01B 7/04; H01B 7/08; H01B 13/00
[52] U.S. Cl. .................. 174/117 PC; 29/829; 156/50; 361/398
[58] Field of Search .......... 174/117 PC; 361/398; 29/829, 846; 156/47, 50

[56] References Cited
U.S. PATENT DOCUMENTS
3,898,371 8/1975 Bridgett .................. 174/117 F

*Primary Examiner*—J. V. Truhe
*Assistant Examiner*—Morris H. Nimmo
*Attorney, Agent, or Firm*—Lawrence S. Levinson; Sanford J. Asman

[57] ABSTRACT

Elongated, flexible printed circuit board coaxial cable which is made using a pattern on a flexible PCB substrate on which coaxial cables are formed is described. A series of slits and folds allows one or more elongated cables to be formed in each pattern. Such cables are particularly useful for connecting multi-connector apparatus of the type which requires coaxial cables interconnected in very close spaces, such as the type used in ultrasound transducers.

The method for manufacturing such elongated, flexible printed circuit board coaxial cable is also described. The method includes forming a pattern on a flexible PCB substrate on which coaxial cables are formed. Thereafter, a series of slits and folds allows one or more elongated cables to be formed in each pattern.

Such cables are particularly useful for connecting multi-connector apparatus of the type which requires coaxial cables interconnected in very close spaces, such as the type used in ultrasound transducers.

8 Claims, 4 Drawing Figures